(12) United States Patent
Johnson et al.

(10) Patent No.: US 11,855,428 B2
(45) Date of Patent: Dec. 26, 2023

(54) WALL PLATE SYSTEM FOR INDOOR WALL SWITCHES

(71) Applicant: ABL IP Holding LLC, Atlanta, GA (US)

(72) Inventors: John R. Johnson, Flowery Branch, GA (US); Steven E. Downs, Lilburn, GA (US); Dennis M. Hoskins, Monroe, GA (US); Richard L. Westrick, Jr., Social Circle, GA (US); Kaitlyn K. Mulcahy, Colechester, CT (US); Wesley D. McIntire, Cheshire, CT (US)

(73) Assignee: ABL IP Holding LLC, Atlanta, GA (US)

( * ) Notice: Subject to any disclaimer, the term of this patent is extended or adjusted under 35 U.S.C. 154(b) by 98 days.

(21) Appl. No.: 17/338,975

(22) Filed: Jun. 4, 2021

(65) Prior Publication Data

US 2022/0393452 A1 Dec. 8, 2022

(51) Int. Cl.
*H02G 3/14* (2006.01)
*H05K 5/06* (2006.01)

(52) U.S. Cl.
CPC .............. *H02G 3/14* (2013.01); *H05K 5/061* (2013.01)

(58) Field of Classification Search
CPC ............ H02G 3/14; H02G 3/08; H02G 3/081; H02G 3/12; H05K 5/06; H05K 5/03; H05K 5/069; H05K 5/0247; H05K 5/0217; H05K 5/061
USPC .......... 174/66, 67, 53, 57, 58; 220/241, 242, 220/3.3, 3.2
See application file for complete search history.

(56) References Cited

U.S. PATENT DOCUMENTS

| | | | | |
|---|---|---|---|---|
| 3,987,928 A | * | 10/1976 | Mori | H02G 3/14 220/241 |
| 5,073,681 A | * | 12/1991 | Hubben | H02G 3/14 174/66 |
| 5,180,886 A | * | 1/1993 | Dierenbach | H02G 3/14 220/241 |
| D379,453 S | | 5/1997 | Fabrizi | |
| 5,723,817 A | * | 3/1998 | Arenas | H02G 3/14 220/241 |
| D430,478 S | | 9/2000 | De brey et al. | |
| D461,114 S | | 8/2002 | Aubert | |
| D493,695 S | | 8/2004 | Wengrower | |
| D508,198 S | | 8/2005 | Holger | |
| D511,675 S | | 11/2005 | Holger | |
| 6,979,777 B2 | | 12/2005 | Marcou et al. | |
| 7,122,740 B2 | | 10/2006 | Xu et al. | |
| D550,076 S | | 9/2007 | Ni | |
| D560,174 S | | 1/2008 | Sinai | |

(Continued)

OTHER PUBLICATIONS

U.S. Appl. No. 29/794,121, Notice of Allowance, dated Dec. 13, 2022, 8 pages.

*Primary Examiner* — Angel R Estrada
(74) *Attorney, Agent, or Firm* — Kilpatrick Townsend & Stockton LLP

(57) ABSTRACT

A wall plate system for an electrical device, including but not limited to indoor wall switches, includes a wall plate and a shield. The wall plate defines an aperture, and the wall plate is configured to receive a portion of an electrical device in the aperture. The shield extends at least partially through the aperture, and the shield is configured to form a seal between the wall plate and the electrical device.

19 Claims, 8 Drawing Sheets

(56) References Cited

U.S. PATENT DOCUMENTS

| | | | |
|---|---|---|---|
| 7,709,735 B2 * | 5/2010 | Vigorito | H02G 3/14 174/67 |
| 7,902,458 B2 * | 3/2011 | Eshelman | H02G 3/14 174/67 |
| 7,947,903 B2 * | 5/2011 | Peck | H02G 3/14 174/67 |
| 8,420,956 B2 * | 4/2013 | Alderson | H02G 3/12 174/67 |
| D732,482 S | 6/2015 | Hagarty | |
| D759,740 S | 6/2016 | Thomsen | |
| 10,389,098 B2 | 8/2019 | Shotey | |

\* cited by examiner

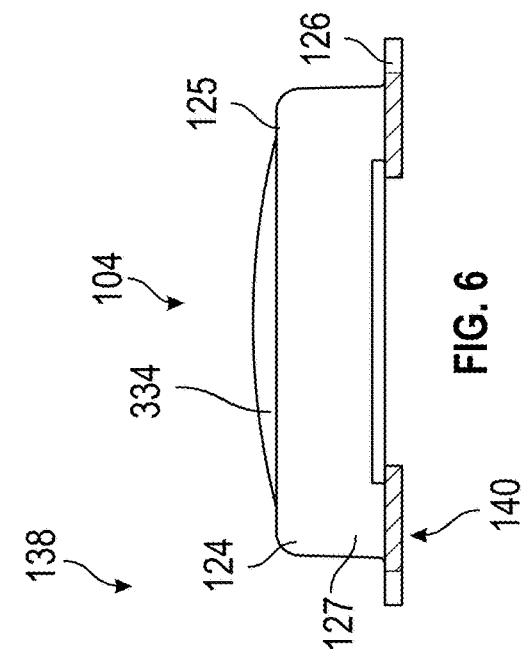
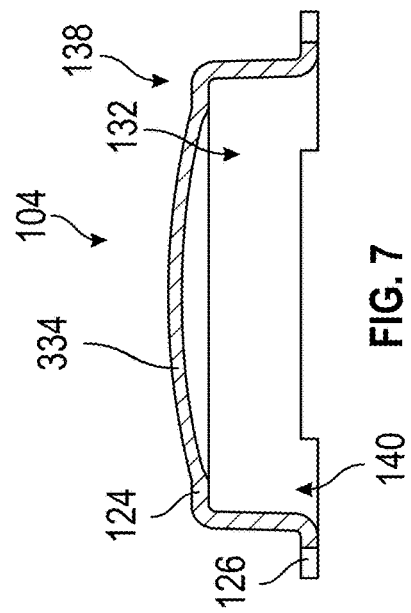
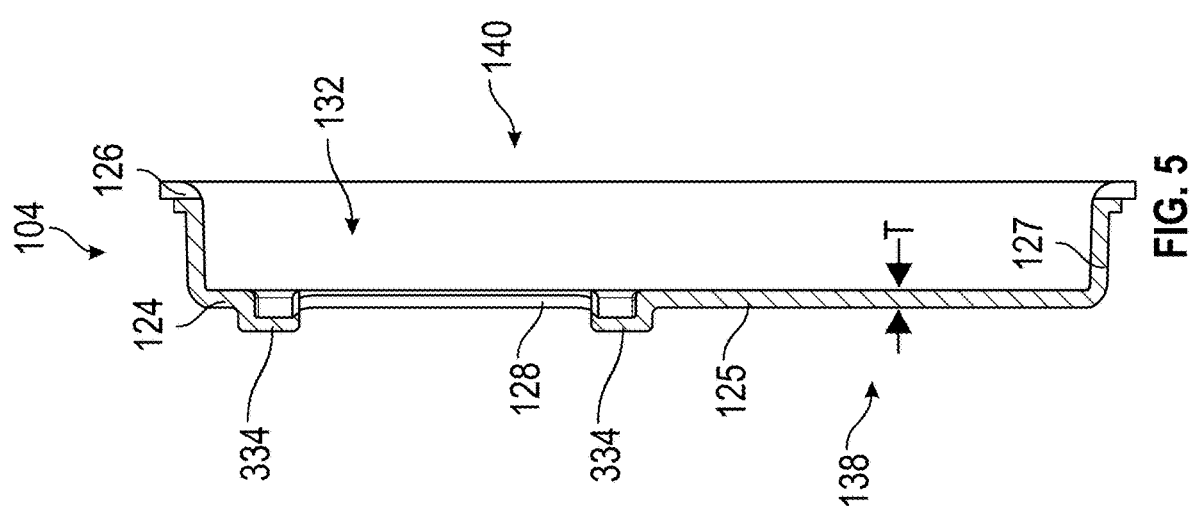

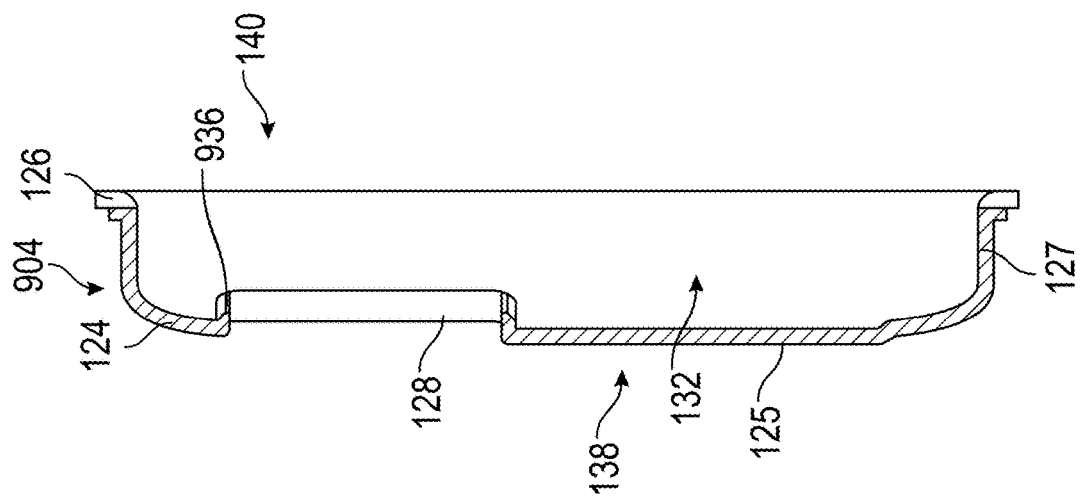
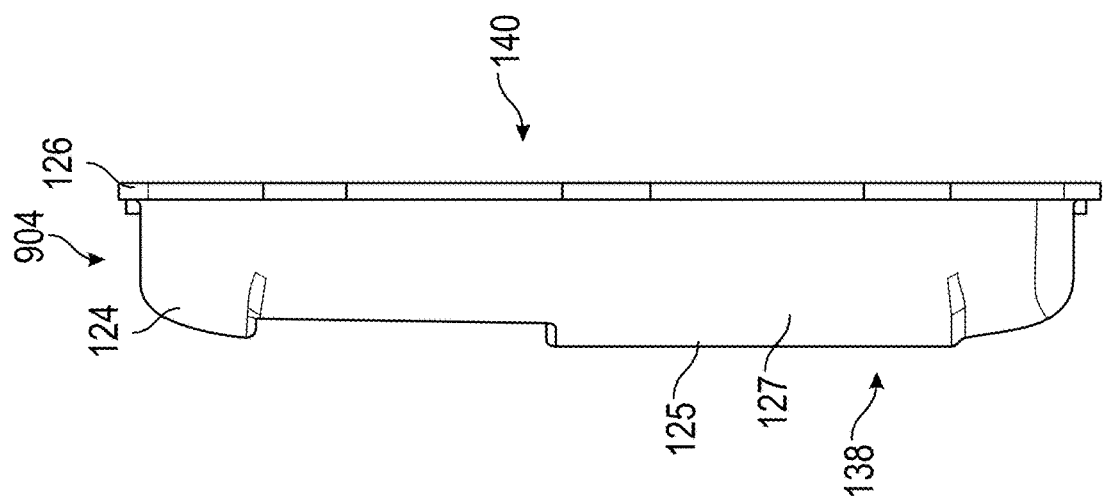

WALL PLATE SYSTEM FOR INDOOR WALL SWITCHES

FIELD OF THE INVENTION

This application relates wall switch devices, and, more particularly, to wall plate systems for wall switch devices.

BACKGROUND

Wall switch devices are used in both indoor and outdoor applications and are commonly used to control one or more electrical devices. For example, wall switches may be used for lights, fans, outlets, and/or other devices as desired to selectively turn on or turn off electrical current for such devices. Wall plates are commonly used with wall switch devices to cover the wall switch devices and limit inadvertent or unintentional contact with a wire or other conducting portion of the wall switch devices. While wall plates offer some level of protection, they are generally installed over wall switch devices such that one or more gaps are defined between a wall plate and a wall switch device. Such gaps create points of ingress for liquids and/or other materials to reach the wall switch device and potentially detrimentally impact its operation.

SUMMARY

The terms "invention," "the invention," "this invention" and "the present invention" used in this patent are intended to refer broadly to all of the subject matter of this patent and the patent claims below. Statements containing these terms should be understood not to limit the subject matter described herein or to limit the meaning or scope of the patent claims below. Embodiments of the invention covered by this patent are defined by the claims below, not this summary. This summary is a high-level overview of various embodiments of the invention and introduces some of the concepts that are further described in the Detailed Description section below. This summary is not intended to identify key or essential features of the claimed subject matter, nor is it intended to be used in isolation to determine the scope of the claimed subject matter. The subject matter should be understood by reference to appropriate portions of the entire specification of this patent, any or all drawings, and each claim.

According to certain embodiments, a wall plate system includes a wall plate that defines an aperture and is configured to receive a portion of an electrical device in the aperture. The wall plate system also includes a shield extending at least partially through the aperture. In various embodiments, the shield is configured to form a seal between the wall plate and the electrical device.

According to some embodiments, a wall plate system includes a wall plate having a first side, a second side, and an aperture extending through the wall plate from the first side to the second side. The wall plate system also includes a shield having a shield body and a shield flange extending outwards from the shield body. In some embodiments, the shield body extends at least partially through the aperture of the wall plate, and the shield body is configured to cover at least a portion of an electrical device extending through the aperture of the wall plate. In certain embodiments, at least a portion of the second side of the wall plate overlaps the shield flange.

According to various embodiments, a wall plate system includes a wall plate defining an aperture and a shield includes a shield body and a shield flange. The shield body extends through the aperture of the wall plate in a first direction, and the wall plate overlaps the shield flange in the first direction. In various embodiments the shield is configured to form a seal between the wall plate and an electrical device.

Various implementations described in the present disclosure can include additional systems, methods, features, and advantages, which cannot necessarily be expressly disclosed herein but will be apparent to one of ordinary skill in the art upon examination of the following detailed description and accompanying drawings. It is intended that all such systems, methods, features, and advantages be included within the present disclosure and protected by the accompanying claims.

BRIEF DESCRIPTION OF THE DRAWINGS

The features and components of the following figures are illustrated to emphasize the general principles of the present disclosure. Corresponding features and components throughout the figures can be designated by matching reference characters for the sake of consistency and clarity.

FIG. 5 is a sectional view of the shield of FIG. 3.

FIG. 6 is an end view of the shield of FIG. 3.

FIG. 7 is another sectional view of the shield of FIG. 3.

FIG. 10 is a side view of the shield of FIG. 9.

FIG. 11 is a sectional view of the shield of FIG. 9.

DETAILED DESCRIPTION

Figure 1:
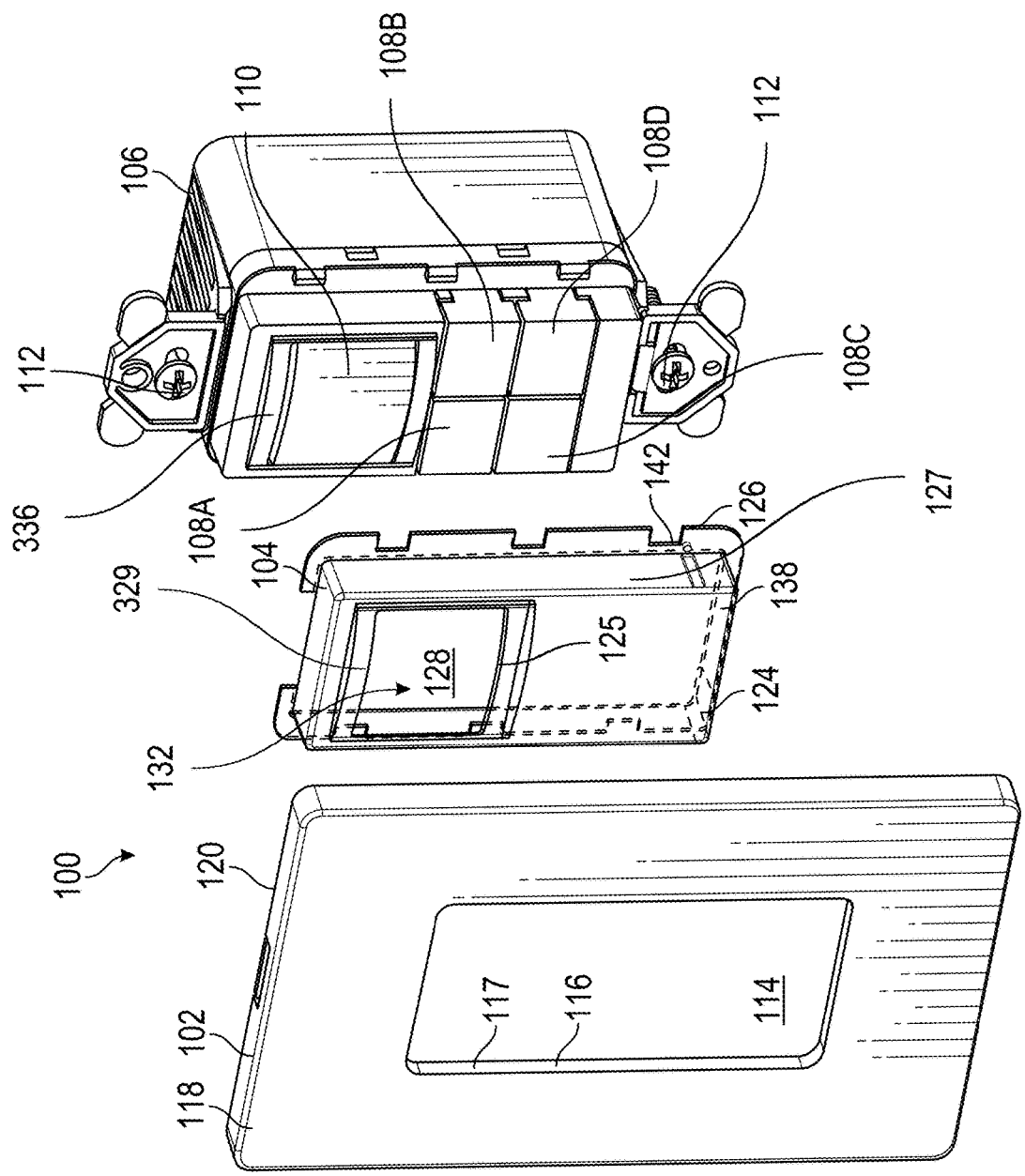
FIG. 1 is an exploded view of a wall plate system according to various embodiments with a wall switch.

The subject matter of embodiments of the present invention is described here with specificity to meet statutory requirements, but this description is not necessarily intended to limit the scope of the claims. The claimed subject matter may be embodied in other ways, may include different elements or steps, and may be used in conjunction with other existing or future technologies. This description should not be interpreted as implying any particular order or arrangement among or between various steps or elements except when the order of individual steps or arrangement of elements is explicitly described. Directional references such as "up," "down," "top," "bottom," "left," "right," "front," and "back," among others are intended to refer to the orientation as illustrated and described in the figure (or figures) to which the components and directions are referencing but are not intended to imply any particular configuration.

Described herein are wall plate systems for electrical devices including but not limited to indoor electrical devices. In some non-limiting embodiments, the wall plate systems discussed herein may be provided with indoor electrical devices including but not limited to indoor wall switches, indoor electrical outlets, and/or indoor mechanical buttons. In various embodiments, these indoor electrical devices may optionally include one or sensors, including but not limited to occupancy sensors (e.g., passive infrared (PIR), ultrasonic, active infrared, time of flight, acoustic, camera-based, etc.), photocell sensors and associated electronics, optical sensors, combinations thereof, or other sensors as desired. The wall plate systems described herein include a wall plate and a protective mask or shield. The wall plate may at least partially cover the electrical device and/or at least a portion of the electrical device may extend through one or more apertures defined in the wall plate. The shield of the wall plate system at least partially covers the electrical device in the aperture of the wall plate. In certain embodiments, the shield may cover touch areas of the electrical device that are commonly touched and thus cleaned and/or wiped with disinfectant liquids, cleaning agents, cleaning compounds, and the like. The shield may minimize and/or prevent liquids from entering the electrical device via the aperture in the wall plate. In certain embodiments, the shield is provided between the electronics device and the wall plate. Optionally, the shield may form a seal between the wall plate and the electronics device in at least two directions (e.g., in a front-to-back direction and in a side-to-side direction of the wall plate). In various embodiments, the shield may form a seal around sensor components of the electronics device (e.g., IR detection optics or others) to maintain targeted sensory performance without degradation due to the shield. In other words, the shield may allow for the electronics device (including sensor components) to otherwise function as normal while also protecting the electronics device from liquids and/or other potential contaminants that may enter the electronics device via the aperture in the wall plate. Optionally, the shield may be compliant with various protection ratings or standards (e.g., waterproof standards, fire standards, etc.) to provide further protection to the electronics device. In one non-limiting example, the shield may be compliant with the UL 94 HB test standard for flammability (Underwriters Laboratories test standard UL 94, edition 6, Mar. 28, 2013).

Figure 2:
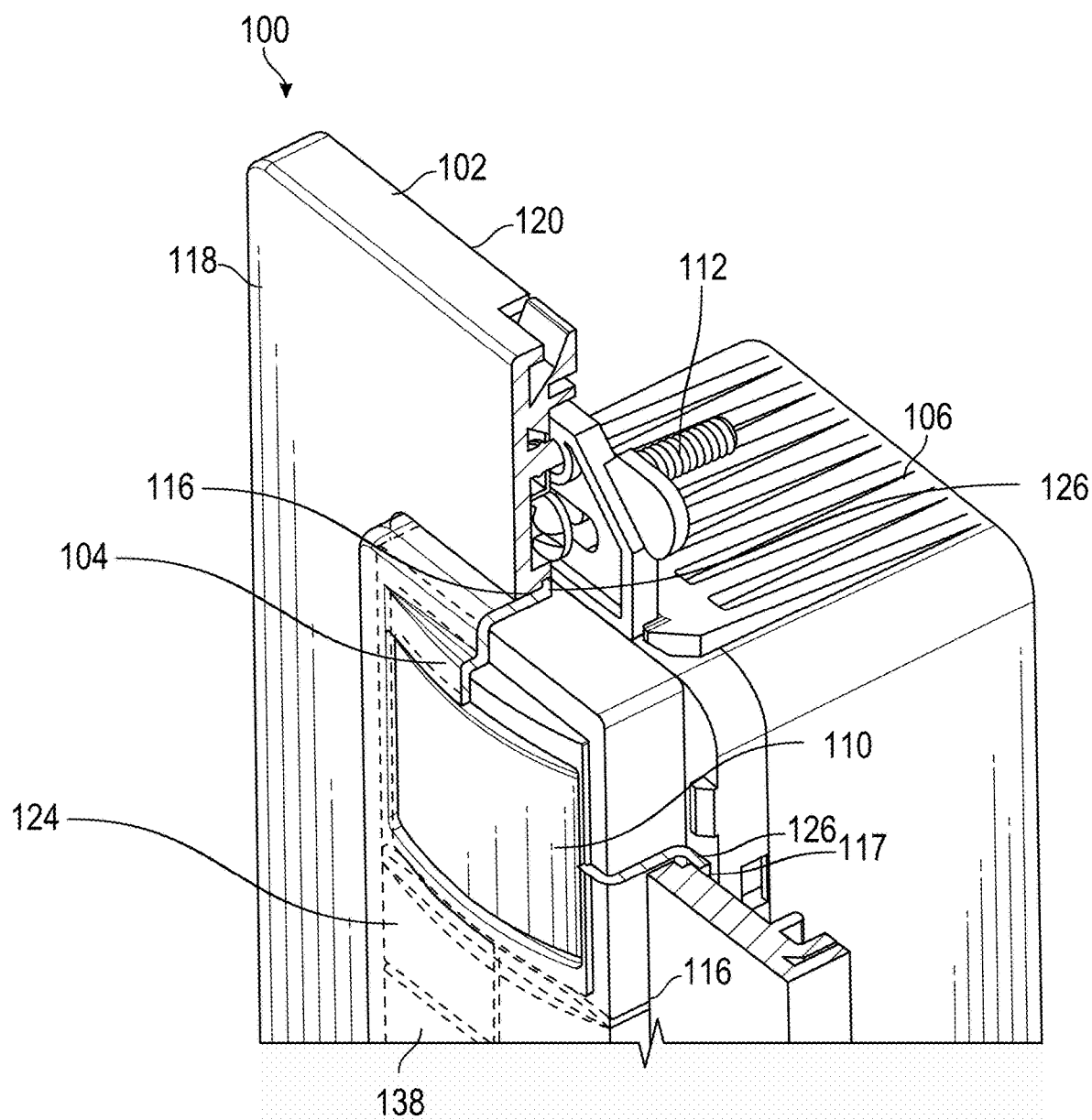
FIG. 2 is a perspective view of the wall plate system and the wall plate of FIG. 1 with a portion of the wall plate system cut away.
Figure 4:
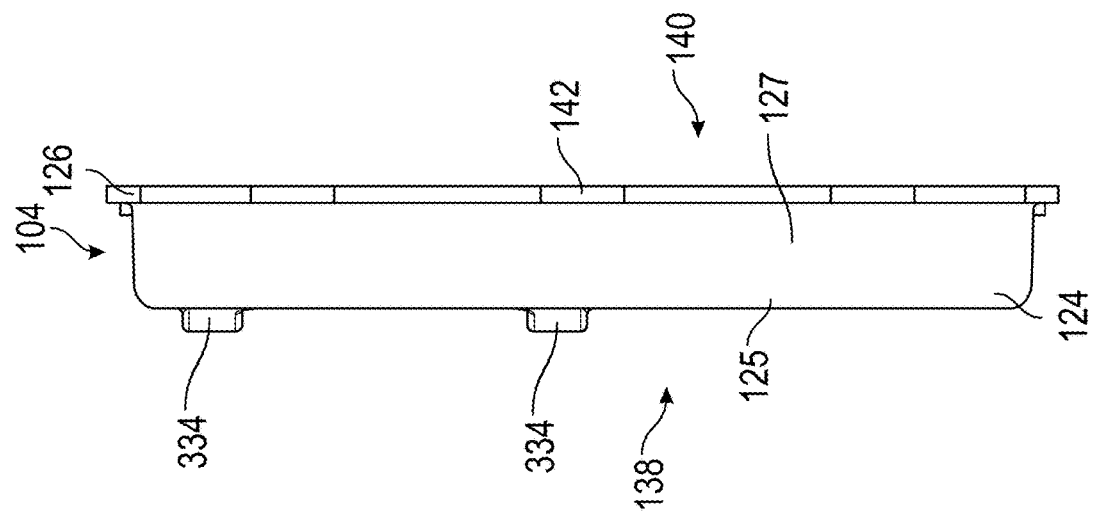
FIG. 4 is a side view of the shield of FIG. 3.
Figure 3:
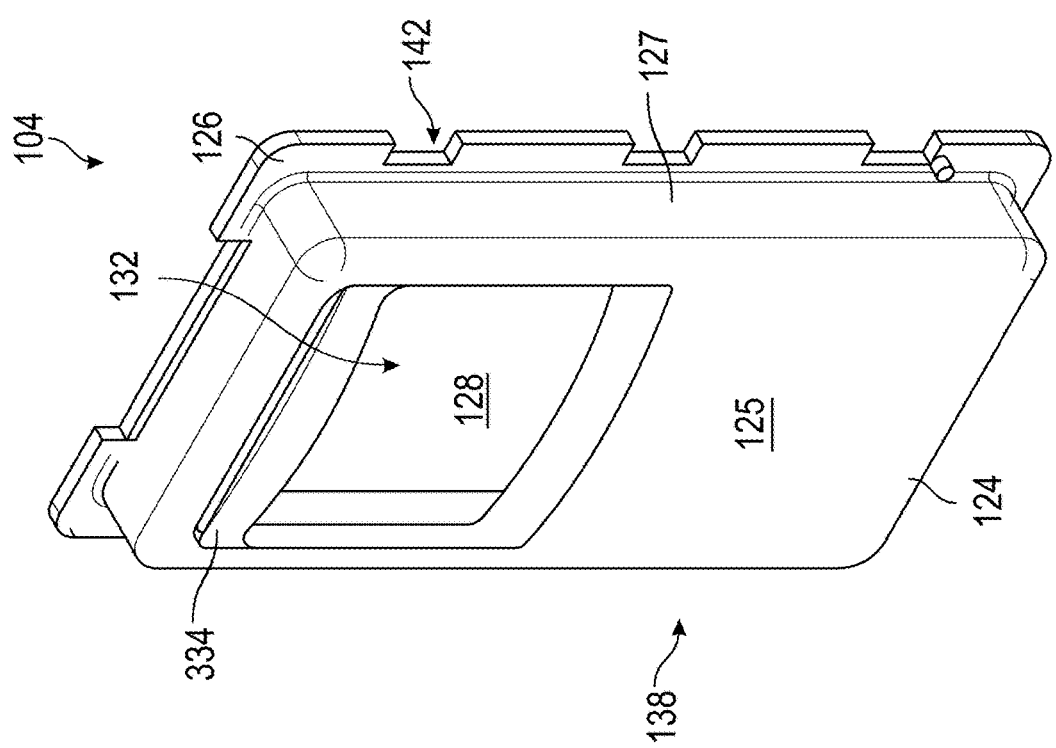
FIG. 3 is a perspective view of a shield of a wall plate system according to various embodiments.
Figure 9:
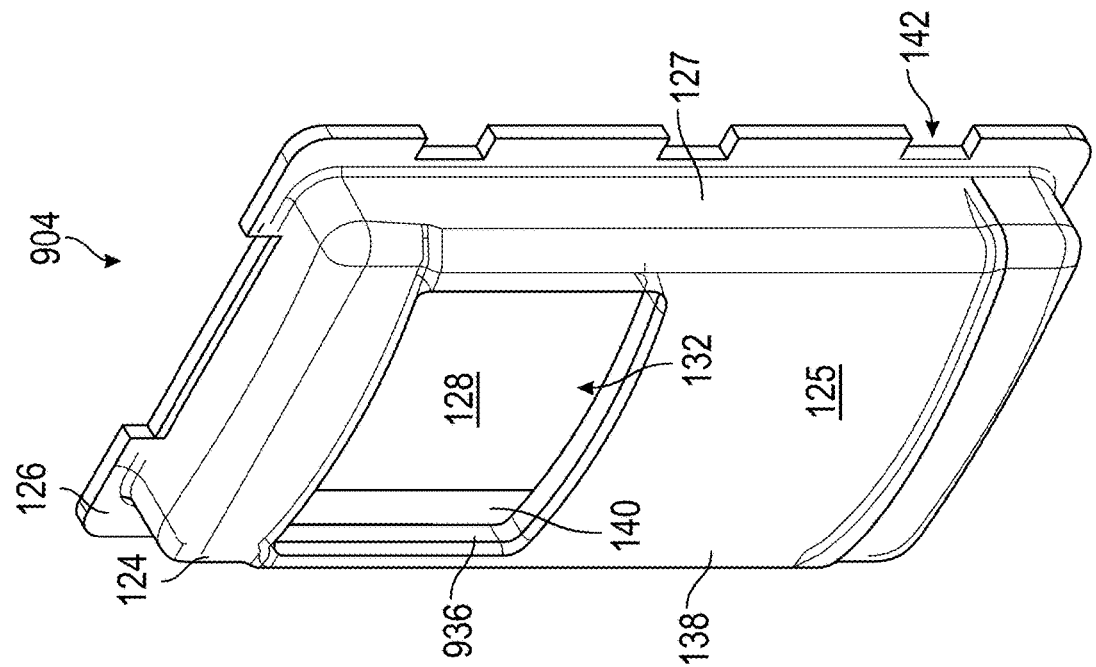
FIG. 9 is a perspective view of a shield of a wall plate system according to various embodiments.

FIGS. 1 and 2 illustrate an example of a wall plate system 100 that includes a wall plate 102 and a shield 104 according to various embodiments. As illustrated in FIGS. 1 and 2, the wall plate system 100 may be used to at least partially cover and/or conceal an electronics device 106.

The wall plate system 100 may be utilized with various types of electronics devices 106 as desired, and the electronics device 106 illustrated in FIGS. 1 and 2 should not be considered limiting. In some non-limiting embodiments, the electronics device 106 may be an outlet, a mechanical switch, a mechanical button, any combination thereof, and/ or other devices as desired. A single electronics device 106 may also include one or more of various features (e.g., one or more switches, one or more outlets, one or more buttons, etc.). Optionally, the electronics device 106 may include one or more sensors, including but not limited to optical sensors, PIR occupancy sensors, photocell sensors, and/or otherwise as desired. In certain embodiments, the electronics device 106 may optionally be an indoor electronics device and may configured to be mounted on and/or in a wall (e.g., via a switch box or the like), although it need not be in other embodiments. In the embodiment of FIGS. 1 and 2, the electronics device 106 includes four buttons 108A-D and a PIR occupancy sensor 110, and is configured to be mounted at least partially within a wall via fasteners such as screws 112.

As best illustrated in FIG. 1, the wall plate 102 of the wall plate system 100 includes at least one aperture 114. The number, shape and/or location of the aperture(s) 114 should not be considered limiting and may be adjusted depending on a type of electronics device 106 that will be assembled with the wall plate system 100. Similarly, the shape of the overall wall plate 102 may be various shapes as desired and is not limited to the shape illustrated in FIG. 1. In various embodiments, the wall plate 102 may include a plurality of apertures 114, which may or may not have different shapes, sizes, orientations, etc. as desired. In certain embodiments, the wall plate 102 includes a first (front) side 118 and an opposing second (rear) side 120, and an inner PLATE wall 116 that defines the aperture 114 such that the aperture 114 extends through the wall plate 102 from the first side 118 to the second side 120.

As best illustrated in FIG. 2, a portion of the electronics device 106 may extend through the aperture 114 when the wall plate system 100 is assembled with the electronics device 106. While not illustrated in FIGS. 1 and 2, the wall plate 102 may optionally include various attachment features such that the wall plate 102 may be attached to a surface (e.g., wall) that includes the electronics device 106 and/or the electronics device 106 itself. Attachment features may include but are not limited to apertures for receiving fasteners, clips, hooks, pins, adhesive tape, combinations thereof, and/or other features as desired. The wall plate 102 may be constructed from various suitable materials as desired, including but not limited to various metals, plastics, composites, stone, ceramic, wood, natural materials, synthetic materials, combinations thereof, and/or other suitable materials.

The shield 104 (shown in isolation in FIGS. 3-7) is configured to form a seal between the electrical device 106 and the wall plate 102. The shield 104 may be constructed from various suitable materials capable of forming a seal with the wall plate 102. In some embodiments, the shield 104 may be a compressible material and/or a flexible material. In certain non-limiting embodiments, the shield 104 may be constructed from a material such as various rubbers, silicone, combinations thereof, or other materials as desired. In certain aspects, the shield 104 may be constructed from various clear or opaque, flexible materials. The shield 104 may have various wall thicknesses T as desired, and in certain embodiments, the shield 104 may have a non-uniform wall thickness in that the thickness T of the shield 104 is different at different locations on the shield T. In some non-limiting embodiments, the shield 104 may have a wall thickness of less than or equal to 0.065 inches, such as less than or equal to 0.060 inches, such as about 0.050 inches. In other embodiments, the shield 104 may have other wall thicknesses as desired.

As best illustrated in FIG. 1, the shield 104 includes a shield body 124 formed of a front wall 125 and sidewalls 127 and an optional shield flange 126 that extends laterally outwards from one or more of the sidewalls 127 of the shield body 124. The shield flange 126 may extend entirely around the perimeter of the shield body 124 or may include one or more cutout features 142 for receiving portions of the wall plate 102 and/or the electronics device 106.

The shape of the shield body 124 and/or the shield flange 126 should not be considered limiting on the disclosure as the shield 104 may have various shapes and/or configurations as desired. The shield body 124 includes a first (front) side 138 and a second (rear) side 140. In various embodiments, the second side 140 defines a receiving area 132 that is configured to accommodate at least a portion of the electronics device 106. Note that in some embodiments the surface on the second side 140 of the shield body 124 that defines the receiving area 132 can be contoured to approximately or exactly match the profile of the surface of the electronics device 106 that will be received in the receiving area 132. In this way, a close fit is created between the shield 104 and the electronics device 106. By way only of example, projections 334 are formed in shield 104 to receive corresponding projections 336 on electronics device 106. In addition to permitting a tight fit between the two components, engagement of projections 334, 336 also helps to align the shield 104 on the electronics device 106.

Referring to FIG. 2, the shield body 124 extends at least partially through the aperture 114 of the wall plate 102 such that the front wall 125 is exposed within the aperture 114. Optionally, a portion of the shield body 124 extends beyond the first side 138 of the wall plate 102 in a direction away from the second side 140 such that the front wall 125 is biased off the wall plate 102 and does not extend flush with the wall plate 102. In certain embodiments and when so positioned, the sidewalls 127 of the shield body 124 contact the inner plate wall 116 such that a first seal is formed between the inner plate wall 116 and the sidewalls 127 so as to help prevent the ingress of liquids and other contaminants into the aperture 114 in a direction from the first side 138 towards the second side 140 of the wall plate 102.

Figure 8:
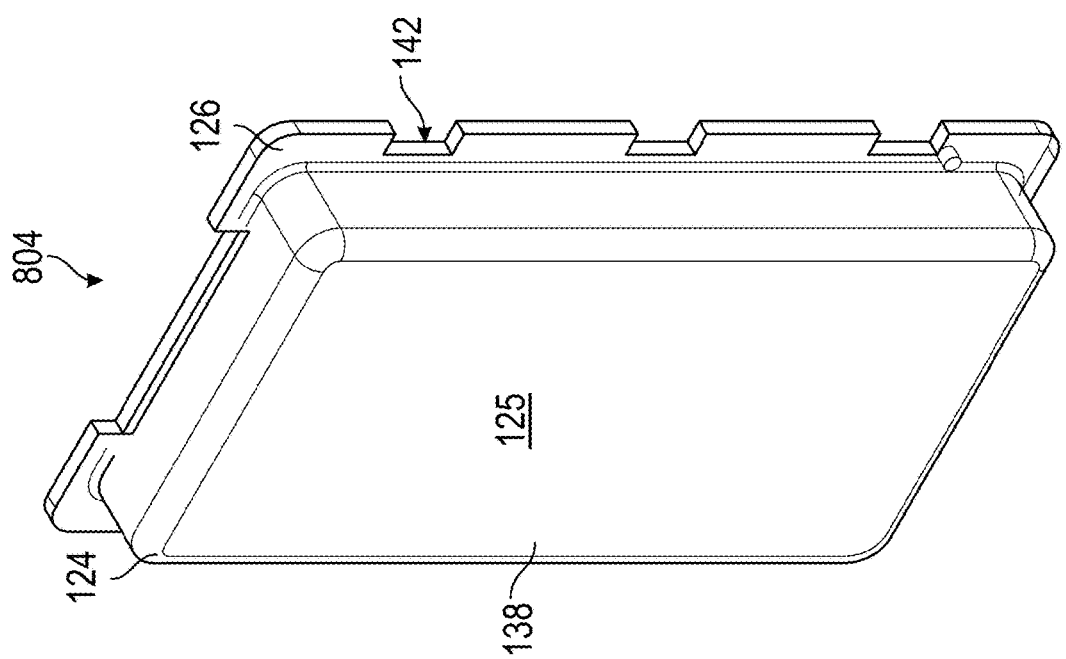
FIG. 8 is a perspective view of a shield of a wall plate system according to various embodiments.

In various embodiments, a rear surface 117 of the wall plate 102 engages the shield flange 126 such that a second seal is formed between the rear surface 117 and the shield flange 126 so as to help prevent the lateral spread of any liquids that are able to gain entry despite the first seal. As best illustrated in FIG. 2, when the wall plate system 100 is assembled with the electronics device 106, the shield 104 is sandwiched between the electronics device 106 and the wall plate 102 and may cover and/or seal the portion of the electronics device 106 extending through the aperture 114 of the wall plate 102. In certain embodiments, the shield 104 may cover one or more buttons 108A-D and/or switches of the electronics device 106 while still enabling operation of the buttons and/or switches. Optionally, the front wall 125 of the shield body 124 may define a shield aperture 128. As best illustrated in FIG. 2, when the wall plate system 100 is assembled with the electronics device 106, the shield aperture 128 may allow for a portion of the electronics device 106 that is extending through the aperture 114 to be uncovered. In the embodiment of FIGS. 1 and 2, the sensor 110 of the electronics device 106 is uncovered (via the shield aperture 128) while the buttons 108A-D of the electronics device are covered by the shield body 124. However, the shield apertures 128 may not be desired in all embodiments. For example, FIG. 8 discloses a shield 804 that is devoid of a shield aperture 128 in the front wall 125.

Figure 13:
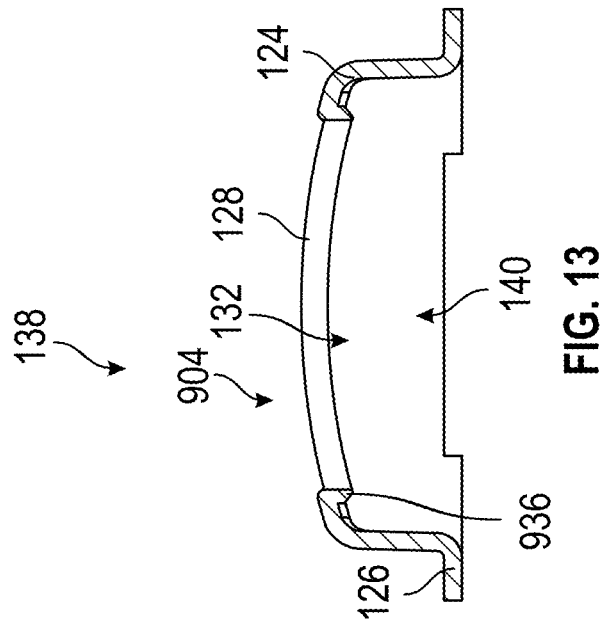
FIG. 13 is another sectional view of the shield of FIG. 9.
Figure 12:
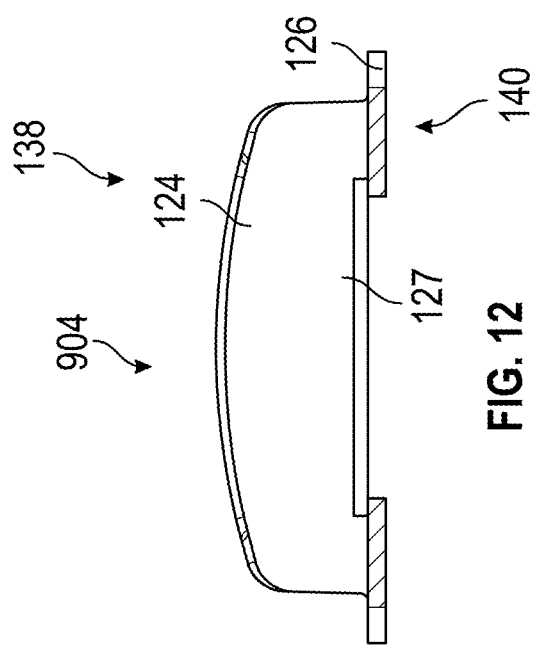
FIG. 12 is an end view of the shield of FIG. 9.

FIGS. 9-13 illustrate another embodiment of a shield 904 for a wall plate system according to various embodiments. The shield 904 is substantially similar to the shield 104 except that the shield 904 has a shape and profile that is not as angular as the shield 104. As best illustrated in FIGS. 11 and 13, in various embodiments, the shield 904 includes a lip 936 that extends along at least a portion of a perimeter of the shield aperture 128 towards the second side 140 of the shield 904. In various embodiments, the lip 936 extends inward into the receiving area 132 of the shield 904 and is configured to contact the electronics device 106 seated within the receiving area 132. In various embodiments, the lip 936 may provide an additional seal with the electronics device 106. In certain embodiments, the lip 936 may provide contact with and/or a seal with the electronics device 106 in embodiments where the shape of the shield 904 does not exactly match the shape of the electronics device 106.

Figure 14:
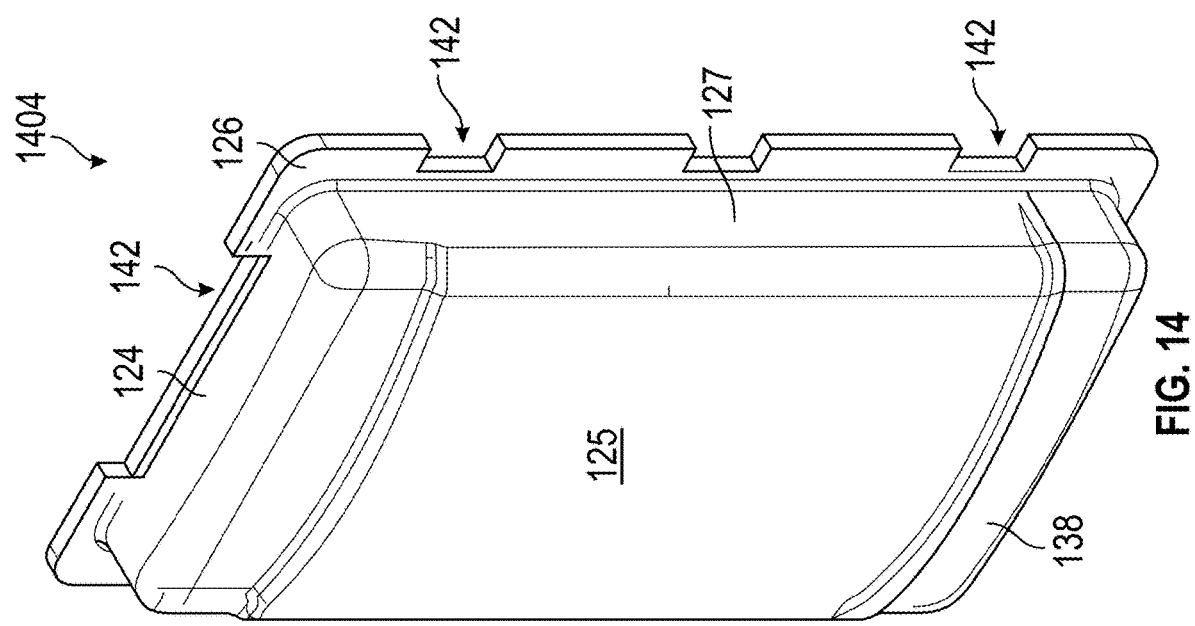
FIG. 14 is a perspective view of a shield of a wall plate system according to various embodiments.

FIG. 14 illustrates another embodiment of a shield 1404 for a wall plate system according to various embodiments. The shield 1404 is substantially similar to the shield 904 except that the shield 1404 omits the shield aperture 128.

A collection of exemplary embodiments are provided below, including at least some explicitly enumerated as "Illustrations" providing additional description of a variety of example embodiments in accordance with the concepts described herein. These illustrations are not meant to be mutually exclusive, exhaustive, or restrictive; and the disclosure not limited to these example illustrations but rather encompasses all possible modifications and variations within the scope of the issued claims and their equivalents.

Illustration 1. A wall plate system comprising: a wall plate defining an aperture, wherein the wall plate is configured to receive a portion of an electrical device in the aperture, and a shield extending at least partially through the aperture, wherein the shield is configured to form a seal between the wall plate and the electrical device.

Illustration 2 The wall plate system of any preceding or subsequent illustrations or combination of illustrations, wherein the shield comprises a flexible and/or compressible material.

Illustration 3. The wall plate system of any preceding or subsequent illustrations or combination of illustrations, wherein the shield comprises silicone or another clear or opaque, flexible material.

Illustration 4. The wall plate system of any preceding or subsequent illustrations or combination of illustrations, where the shield comprises a shield body and a shield flange extending outwards from the shield body, wherein at least a portion of the shield body extends through the aperture and the wall plate overlaps at least a portion of the shield flange.

Illustration 5 The wall plate system of any preceding or subsequent illustrations or combination of illustrations, wherein a first seal is defined between the shield body and an aperture surface of the aperture of the wall plate and a second seal is defined between the wall plate and the shield flange.

Illustration 6. The wall plate system of any preceding or subsequent illustrations or combination of illustrations, wherein a portion of the shield extending through the aperture of the wall plate defines a shield aperture extending through the shield, wherein the shield aperture is configured to engage the electrical device such that a portion of the electrical device extending through the aperture is not covered by the shield.

Illustration 7. The wall plate system of claim 6, wherein the shield further comprises a lip extending along a perimeter of the shield aperture, and wherein the lip is configured to form a seal with the electrical device.

Illustration 8. The wall plate system of any preceding or subsequent illustrations or combination of illustrations, further comprising the electrical device, wherein the electrical device comprises at least one of a mechanical button, a mechanical switch, a passive infrared occupancy sensor, a photocell sensor, or an optical sensor.

Illustration 9. A wall plate system comprising: a wall plate comprising a first side, a second side, and an aperture extending through the wall plate from the first side to the second side; and a shield comprising a shield body and a shield flange extending outwards from the shield body, wherein the shield body extends at least partially through the aperture of the wall plate, wherein the shield body is configured to cover at least a portion of an electrical device extending through the aperture of the wall plate, and wherein at least a portion of the second side of the wall plate overlaps the shield flange.

Illustration 10 The wall plate system of any preceding or subsequent illustrations or combination of illustrations, wherein the aperture comprises an aperture surface, and wherein the shield is configured to form a seal with the aperture surface of the wall plate.

Illustration 11. The wall plate system of any preceding or subsequent illustrations or combination of illustrations, wherein the shield is configured to form a first seal with the wall plate in a front-to-back direction and a second seal with the wall plate in a side-to-side direction.

Illustration 12 The wall plate system of any preceding or subsequent illustrations or combination of illustrations, wherein a portion of the shield extending through the aperture of the wall plate defines a shield aperture extending through the shield, wherein the shield aperture is configured to engage the electrical device such that a portion of the electrical device extending through the aperture is not covered by the shield.

Illustration 13 The wall plate system of any preceding or subsequent illustrations or combination of illustrations, wherein the shield comprises silicone or another clear or opaque, flexible material.

Illustration 14. The wall plate system of any preceding or subsequent illustrations or combination of illustrations, further comprising the electrical device, wherein the electrical device comprises at least one of a mechanical button, a mechanical switch, an occupancy sensor, a photocell sensor, or an optical sensor.

Illustration 15. A wall plate system comprising: a wall plate defining an aperture; and a shield comprising a shield body and a shield flange, wherein the shield body extends through the aperture of the wall plate in a first direction and wherein wall plate overlaps the shield flange in the first direction, wherein the shield is configured to form a seal between the wall plate and an electrical device.

Illustration 16. The wall plate system of any preceding or subsequent illustrations or combination of illustrations, wherein the shield is configured to form a seal between the wall plate and the electrical device at least within the aperture of the wall plate.

Illustration 17. The wall plate system of any preceding or subsequent illustrations or combination of illustrations, wherein a portion of the shield body extending through the aperture of the wall plate defines a shield aperture extending through the shield, wherein the shield aperture is configured to engage the electrical device such that a portion of the electrical device is not covered by the shield.

Illustration 18. The wall plate system of any preceding or subsequent illustrations or combination of illustrations, wherein the shield further comprises a lip extending along a perimeter of the shield aperture and extending in a second direction that is opposite the first direction, and wherein the lip is configured to form a seal with the electrical device.

Illustration 19. The wall plate system of any preceding or subsequent illustrations or combination of illustrations, wherein the shield comprises silicone or another clear or opaque, flexible material.

Illustration 20 The wall plate system of any preceding or subsequent illustrations or combination of illustrations, further comprising the electrical device, wherein the electrical device comprises at least one of a mechanical button, a mechanical switch, a passive infrared occupancy sensor, a photocell sensor, or an optical sensor.

The above-described aspects are merely possible examples of implementations, merely set forth for a clear understanding of the principles of the present disclosure. Many variations and modifications can be made to the above-described example(s) without departing substantially from the spirit and principles of the present disclosure. All such modifications and variations are intended to be included herein within the scope of the present disclosure, and all possible claims to individual aspects or combinations of elements or steps are intended to be supported by the present disclosure. Moreover, although specific terms are employed herein, as well as in the claims that follow, they are used only in a generic and descriptive sense, and not for the purposes of limiting the described invention, nor the claims that follow.

That which is claimed is:

1. A wall plate system comprising:
   a wall plate comprising a first side, a second side, and an aperture extending through the wall plate from the first side to the second side; and
   a shield comprising a shield body and a shield flange extending outwards from the shield body, wherein the shield body extends at least partially through the aperture of the wall plate, wherein the shield body comprises a first portion extending in a first direction and a second portion extending in a second direction, the second direction different from the first direction, wherein the first portion and the second portion of the shield body are configured to cover at least a portion of an electrical device extending through the aperture of the wall plate, and wherein at least a portion of the second side of the wall plate overlaps the shield flange.

2. The wall plate system of claim 1, wherein the aperture comprises an aperture surface, and wherein the shield is configured to form a seal with the aperture surface of the wall plate.

3. The wall plate system of claim 2, wherein the shield is configured to form a first seal with the wall plate in a front-to-back direction and a second seal with the wall plate in a side-to-side direction.

4. The wall plate system of claim 1, wherein a portion of the shield extending through the aperture of the wall plate defines a shield aperture extending through the shield, wherein the shield aperture is configured to engage the electrical device such that a portion of the electrical device extending through the aperture is not covered by the shield.

5. The wall plate system of claim 1, wherein the shield comprises a clear or opaque, flexible material.

6. The wall plate system of claim 1, further comprising the electrical device, wherein the electrical device comprises at least one of a mechanical button, a mechanical switch, a passive infrared occupancy sensor, a photocell sensor, or an optical sensor.

7. A wall plate system comprising:
   a wall plate defining an aperture, wherein the wall plate is configured to receive a portion of an electrical device in the aperture; and
   a shield extending at least partially through the aperture, wherein the shield is configured to form a seal between the wall plate and at least a portion of the electrical device in the aperture.

8. The wall plate system of claim 7, wherein the shield comprises a clear or opaque, flexible material.

9. The wall plate system of claim 7, wherein the shield comprises silicone.

10. The wall plate system of claim 7, where the shield comprises a shield body and a shield flange extending outwards from the shield body, wherein at least a portion of the shield body extends through the aperture and the wall plate engages at least a portion of the shield flange.

11. The wall plate system of claim 10, wherein a first seal is defined between the shield body and an aperture surface of the aperture of the wall plate and a second seal is defined between the wall plate and the shield flange.

12. The wall plate system of claim 7, wherein a portion of the shield extending through the aperture of the wall plate defines a shield aperture extending through the shield, wherein a portion of the electrical device is exposed within the shield aperture.

13. The wall plate system of claim 12, wherein the shield further comprises a lip extending along a perimeter of the shield aperture, and wherein the lip is configured to form a seal with the electrical device.

14. The wall plate system of claim 7, further comprising the electrical device, wherein the electrical device comprises at least one of a mechanical button, a mechanical switch, an occupancy sensor, a photocell sensor, or an optical sensor.

15. A wall plate system comprising:
a wall plate defining an aperture; and
a shield comprising a shield body and a shield flange, wherein the shield body extends through the aperture of the wall plate in a first direction and wherein wall plate overlaps the shield flange in the first direction, wherein the shield is configured to form a seal between the wall plate and at least a portion of an electrical device in the aperture.

16. The wall plate system of claim 15, wherein a portion of the shield body extending through the aperture of the wall plate defines a shield aperture extending through the shield, wherein the shield aperture is configured to engage the electrical device such that a portion of the electrical device is not covered by the shield.

17. The wall plate system of claim 16, wherein the shield further comprises a lip extending along a perimeter of the shield aperture and extending in a second direction that is opposite the first direction, and wherein the lip is configured to form a seal with the electrical device.

18. The wall plate system of claim 15, wherein the shield comprises a clear or opaque, flexible material.

19. The wall plate system of claim 15, further comprising the electrical device, wherein the electrical device comprises at least one of a mechanical button, a mechanical switch, a passive infrared occupancy sensor, a photocell sensor, or an optical sensor.

* * * * *